United States Patent [19]

Araki et al.

[11] Patent Number: 4,594,526

[45] Date of Patent: Jun. 10, 1986

[54] BIMORPH ELECTROMECHANICAL TRANSDUCER AND CONTROL CIRCUIT DEVICE THEREFOR

[75] Inventors: Shigeru Araki; Hideaki Kato, both of Tokyo, Japan

[73] Assignee: NEC Corporation, Japan

[21] Appl. No.: 552,679

[22] Filed: Nov. 17, 1983

[30] Foreign Application Priority Data

Nov. 19, 1982 [JP] Japan ................... 57-203169

[51] Int. Cl.$^4$ ........................... H01L 41/08
[52] U.S. Cl. ........................ 310/317; 310/332
[58] Field of Search ............. 310/316, 317, 318, 332; 360/77, DIG. 1

[56] References Cited

U.S. PATENT DOCUMENTS

| | | | |
|---|---|---|---|
| 4,093,885 | 6/1978 | Brown | 310/316 X |
| 4,099,211 | 7/1978 | Hathaway | 310/317 X |
| 4,237,399 | 12/1980 | Sakamoto | 310/332 X |

FOREIGN PATENT DOCUMENTS 2537760 3/1977 Fed. Rep. of Germany ...... 310/332

Primary Examiner—Mark O. Budd
Attorney, Agent, or Firm—Ostrolenk, Faber, Gerb & Soffen

[57] ABSTRACT

An electromechanical transducer comprising a bimorph and applicable, for example, to a helical scan type VTR for displacing a magnetic head into alignment with a magnetic track on a videotape, together with a control device for the electromechanical transducer. The bimorph is displaceabe at a free end portion thereof in response to a voltage applied thereacross. The control device comprises a sensor for sensing a displacement of the transducer, a drive circuit for driving the bimorph in response to externally derived drive signals which include a head position compensation drive signal, a feedback circuit for applying negative feedback to the drive circuit in response to a sensed displacement, and a low pass filter for cutting off high frequency components of the drive signal. The feedback circuit includes a high pass filter for reducing frequencies lower than first order resonance frequency.

9 Claims, 5 Drawing Figures

BIMORPH ELECTROMECHANICAL TRANSDUCER AND CONTROL CIRCUIT DEVICE THEREFOR

BACKGROUND OF THE INVENTION

The present invention relates to an electromechanical transducer which may be applied, for example, to a helical scan type videotape recorder (VTR) to displace a magnetic head thereof into alignment with a magnetic track on a videotape. The present invention also relates to a control device for such a transducer.

Prior art electromechanical transducers of the type described include a bimorph which has two piezoelectric elements bonded together, each of the piezoelectric elements carrying electrodes at either side thereof. The bimorph suffers from the drawbacks that its frequency characteristic involves many resonances and antiresonances, and that the linearity attainable therewith is poor due to hysteresis characteristic. Therefore, damping has to be applied to the bimorph in order to control it.

One approach heretofore proposed to meet the demand described above is bonding rubber or like pads to the bimorph to mechanically effect damping. Another approach known in the art is electrical and consists in sensing a position or a velocity of the bimorph by some method, and applying negative feedback to the input after signal processing. The mechanical and electrical approaches have been combined for some applications.

The mechanical damping scheme relying on pads limits the available displacement of the bimorph due to the pads which are fit on the bimorph itself. This will cause the displacement amplitude to become critically small when sufficient damping is effected on the bimorph. The electrical damper, on the other hand, requires an intricate circuit arrangement therefor even if combined with the mechanical damper, because the bimorph involves many resonances and antiresonances.

SUMMARY OF THE INVENTION

It is therefore an object of the present invention to provide an electromechanical transducer and a control device therefor which eliminate the drawbacks inherent in the prior art device as described above.

It is another object of the present invention to provide a control device for an electromechanical transducer which is capable of controlling a bimorph so that the amplitude of the bimorph may not be limited.

It is another object of the present invention to provide a control device for an electromechanical transducer which is capable of controlling a bimorph with a simple circuit arrangement.

It is another object of the present invention to provide a new electromechanical transducer having excellent linearity.

It is another object of the present invention to provide a generally improved electromechanical transducer and a control device therefor.

A control device for an electromechanical transducer a free end portion of which displaces in response to a voltage applied across the transducer of the present invention comprises a sensor for sensing a displacement of the transducer, driver for driving the transducer in response to an externally derived drive signal, feedback circuit for applying negative feedback to the driver in response to an output of the sensor, and a low pass filter for cutting off high frequency components of the drive signal.

In accordance with the present invention, there is disclosed an electromechanical transducer comprising a bimorph and applicable, for example, to a helical scan type VTR for displacing a magnetic head into alignment with a magnetic track on a videotape, together with a control device for the transducer. The bimorph is displaceable at an end portion thereof in response to a voltage applied thereacross. The control device comprises a sensor for sensing a displacement of the transducer, a drive circuit for driving the bimorph in response to externally derived drive signals which include a head position compensation drive signal, a feedback circuit for applying negative feedback to the drive circuit in response to a sensed displacement, and a low pass filter for cutting off high frequency components of the drive signal. The feedback circuit includes a high pass filter for reducing frequencies lower than the first order resonance frequency.

The above and other objects, features and advantages of the present invention will become apparent from the following detailed description taken with the accompanying drawings.

DESCRIPTION OF THE PREFERRED EMBODIMENT

While the electromechanical transducer and control device therefor of the present invention is susceptible of numerous physical embodiments, depending upon the environment and requirements of use, a substantial number of the herein shown and described embodiment have been made, tested and used, and all have performed in an eminently satisfactory manner.

Figure 1:
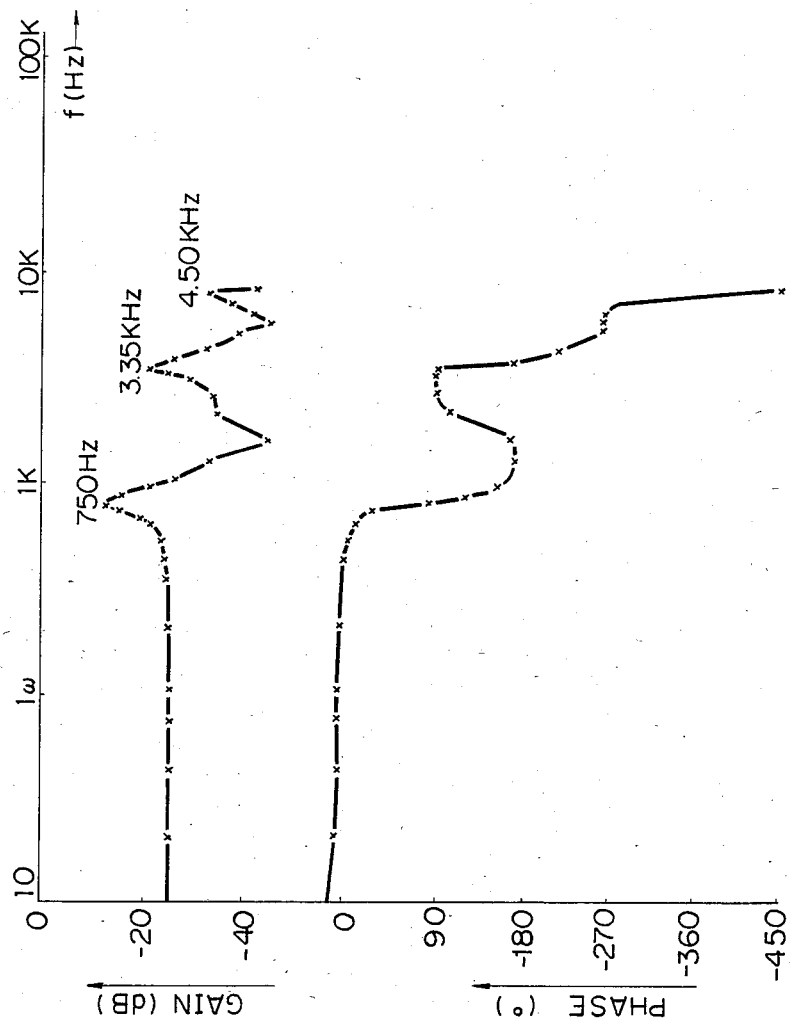
FIG. 1 is a plot showing a frequency characteristic of a bimorph.

For reference purposes, the frequency characteristic of a bimorph is shown in FIG. 1. It will be seen from the curves that the frequency characteristic of a bimorph involves many resonances and antiresonances, as previously described.

Figure 2:
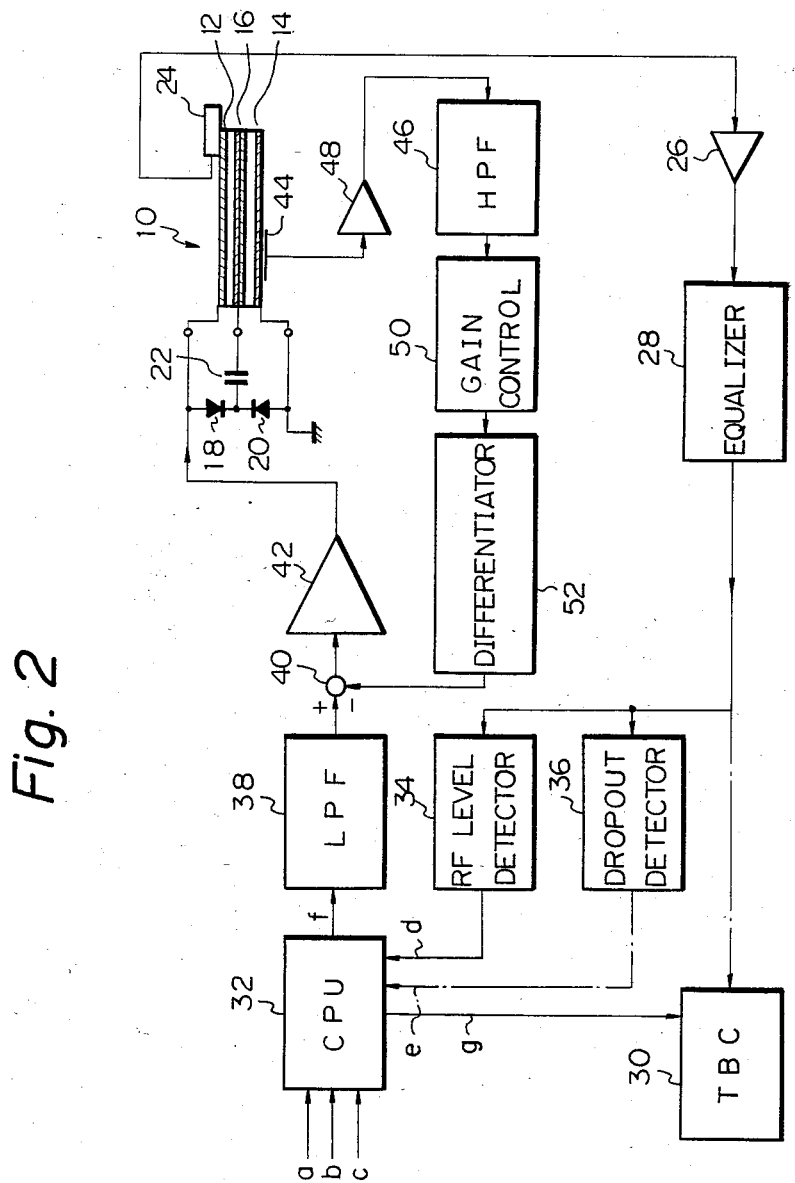
FIG. 2 is a block diagram of a control system for an electromechanical transducer embodying the present invention.

Referring to FIG. 2, an automatic tracking device installed in a videotape recorder (VTR) is shown which employs the principle of the present invention. A bimorph, generally 10, is made up of piezoelectric elements 12 and 14, and a flat metal substrate 16. As will be described in detail, diodes 18 and 20 and a capacitor 22 are connected to the bimorph 10 in order to protect it and improve its characteristics. The bimorph 10 supports at its free end a magnetic head chip 24 which is adapted to transform information stored in a videotape into an electric signal.

The electric signal output from the head chip 24 is amplified by a video preamplifier 26 and, then, converted into an RF signal by an equalizer 28. The RF signal is fed to a time base collector (TBC) 30 after being transformed into a video signal by a limiter, a demodulator, a low pass filter (LPF) and the like (not shown). In the VTR, the head cannot always be aligned with the center of a track on a videotape and may become misaligned due to irregularity introduced into tape transport, dimensional changes of the tape, etc.

Once misalignment of the head with a track occurs as described, the RF level is lowered while the crosstalk of the track with a track adjacent thereto is enhanced, resulting in noticeable signal dropout and noise in the reproduced picture. Meanwhile, in special features such as still picture playback and slow motion playback available with the VTR, the tape transport speed and, therefore, the relative tape and drum speed is different from a speed predetermined for ordinary playback. As a result, the head moves along a locus which straddles a plurality of tracks so that a noise bar appears on the screen in a position where the head spans adjacent tracks.

The tracking problems discussed above are eliminated by the tracking device shown in FIG. 2. Briefly, the tracking device of FIG. 2 positions a magnetic head in such a manner as to maximize the RF signal level and automatically moves the head to a position above a desired track so as to provide only one field of picture during a slow motion or still picture playback.

In FIG. 2, a microprocessor 32 is supplied with an autotracking enable signal a (instructing whether or not to activate the device), a capstan tack signal b (pulse signal indicative of a rotation speed of a capstan reel), and a vertical sync signal c, each from outside the tracking device. Also supplied to the microprocessor 32 are an RF level signal d via an RF level detector 34 and a dropout signal e via a dropout detector 36.

In response to the input signals a to e, the microprocessor 32 generates a head position compensation drive signal f, and a jump 2-track jump-skip signal g. The drive signal f is applied to a low pass filter 38, and the jump-skip signal g to the TBC 30.

The low pass filter 38 functions to reduce frequency components higher than about 70% of the first order resonance frequency of the bimorph, thereby suppressing resonance of the bimorph. Another function assigned to the low pass filter 38 is to eliminate oscillation due to higher order resonance frequencies by reducing an amount of feedback through a feedback loop (which will be described later). The output of the low pass filter 38 is fed to a subtractor 40 which subtracts a feedback signal from the low pass filter output. The output of the subtractor 40 is amplified by a high voltage drive amplifier 42 up to a voltage necessary for driving the bimorph 10. The amplified voltage is applied across the bimorph 10.

A strain gauge 44 is adapted to sense a displacement of the bimorph 10. The output of the strain gauge 44 is applied to a high pass filter (HPF) 46 via a sense amplifier 48, which functions to increase the signal gain. The high pass filter 46 serves to reduce the frequencies lower than the first order antiresonance frequency to thereby eliminate the influence of phase shift. The output of the HPF 46, is fed to a gain control circuit 50 to have its gain controlled and, therefrom, to a differentiator 52 which increases the damping coefficient at the first order resonance point.

Figure 3:
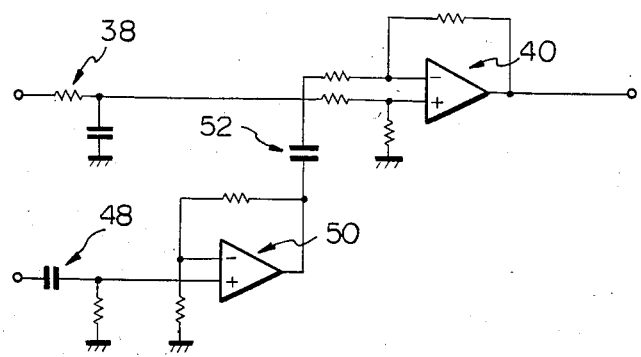
FIG. 3 is a block diagram showing details of a feedback loop included in the circuitry of FIG. 2.

In accordance with the present invention, the circuit elements 10, 44, 48, 46, 50, 52, 40, 42, 18, 20 and 22 constitute a closed loop which makes the displacement waveform of the bimorph 10 saw-toothed when the signal f is saw-toothed. This is particularly effective to eliminate ringing at the leading and trailing edges of the displacement waveform. A practical example of the feedback loop of FIG. 2 is illustrated in FIG. 3.

Also, in accordance with the present invention, the RF is sampled field by field while, in a slow motion or still picture playback, the head is always on-track to reproduce one field, one screen picture without entailing any noise bar. This overcomes the drawback previously discussed.

Hereinafter will be described the bimorph 10 which is employed in the embodiment shown and described as an electromechanical transducer.

Concerning the piezoelectric elements 12 and 14 of the bimorph 10, where they are formed by sintering aggregates of crystallites, a high voltage is applied thereto for poling in view of the fact that the polarization of single crystals becomes oriented in an arbitrary direction. It follows that the application of a high voltage is allowable in the poling direction but not in the direction opposite to the poling direction, inasmuch as such would destroy the polarized structure of the piezoelectric element. It has been customary to check the voltage in the opposite direction to the poling direction by connecting a diode to the piezoelectric elements.

Figure 4:
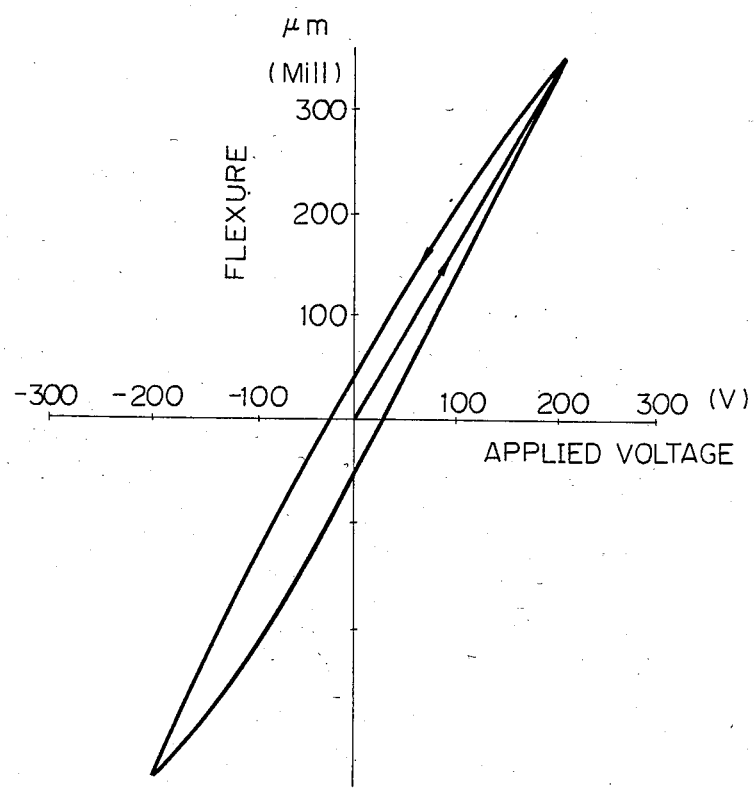
FIG. 4 is a plot representing a hysteresis characterisic of bimorphs in general.

However, if use is made of a bimorph having two oppositely polarized piezoelectric elements, it shows a hysteresis characteristic such as one shown in FIG. 4 due to the inherent polarized structure. Therefore, while a certain predetermined voltage is applied across such a bimorph, instantaneous position of the bimorph depends upon the history, that is, whether the voltage has been raised to the predetermined voltage or lowered to it. Another problem left unsolved is that as the voltage applied across one piezoelectric element is progressively increased, the displacement is progressively decreased relative to the voltage variation due to the drag exerted by the intermediate electrode and other piezoelectric element.

The bimorph of FIG. 2 in accordance with the present invention alleviates the situation described above to such an extent that in effect the non-linearity does not need any consideration. The implementation in accordance with the present invention is such that while a voltage is applied across one of the piezoelectric elements 12 and 14, a voltage proportional thereto is applied across the other piezoelectric element in the opposite direction to the poling direction. The two voltages are proportioned relative to each other in such a manner as to prevent the polarized structures from being destroyed. The transducer in the illustrated embodiment includes a bimorph, two diodes and a capacitor. The bimorph has two piezoelectric elements which are bonded together and individually provided with electrodes at either side. The two diodes are connected to each other at their anodes or cathodes, while being connected to different electrodes of the bimorph at the other end. The capacitor is connected at one end to the junction between the diodes and, at the other end, to the intermediate electrode of the bimorph.

Figure 5:
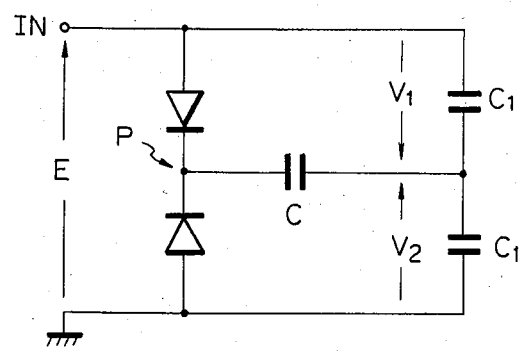
FIG. 5 is a diagram of an equivalent circuit representative of a bimorph and its associated elements which are included in the transducer of the present invention.

The bimorph and its associated elements in the embodiment may be represented by an equivalent circuit as shown in FIG. 5. Supposing that a voltage $+E$ is applied to the input as shown in FIG. 5, a diode 54 becomes conductive and a diode 56 remains non-conductive and, hence, the voltage appearing at a point P is substantially equal to the voltage $+E$. Therefore, based on the law of charge storage, voltages $V_1$ and $V_2$ shown in FIG. 5 may be expressed as:

$$V_1 = -\frac{C_2}{C + C_1 + C_2} E$$

$$V_2 = \frac{C + C_1}{C + C_1 + C_2} E$$

The above equations teach that the input voltage $+E$ can be distributed by a preselected ratio. The distribution ratio is variable by varying the capacity of a capacitor C. In this manner, provision of a capacitor between two diodes and an intermediate electrode of a bimorph realizes a bimorph construction featuring an excellent linearity, without destroying the polarized structures of piezoelectric elements.

Various modifications will become possible for those skilled in the art after receiving the teachings of the present disclosure without departing from the scope of the invention.

What is claimed is:

1. A control device for an electromechanical transducer a free end portion of which displaces in response to a voltage applied across the transducer, said control device comprising:
    sensor means for sensing a displacement of the transducer;
    driver means for driving the transducer in response to an externally derived drive signal;
    feedback means, including a high-pass filter and a differentiator, for applying negative feedback to said driver means in response to an output of the sensor means; and
    a low pass filter for cutting off high frequency components of the drive signal, said feedback means and low pass filter coacting to reduce displacment at resonant frequencies of the transducer.

2. A control device as claimed in claim 1, in which the sensor means comprises a strain gauge.

3. A control device as claimed in claim 1, in which the driver means comprises a high voltage drive amplifier.

4. A control device as claimed in claim 1, in which the feedback means comprises a high pass filter for reducing frequencies lower than first order antiresonance frequencies, a gain control circuit, and a differentiator circuit for providing electrical damping at a first-order resonance frequency of the transducer.

5. A control device as claimed in claim 1, in which the drive signal comprises a head position compensation drive signal.

6. A control device as claimed in claim 1, in which the transducer comprises a bimorph, the low pass filter being constructed to reduce frequency components higher than about 70% of the first order resonance frequency of said bimorph, thereby suppressing resonance of the bimorph.

7. A control device as claimed in claim 6, in which the low pass filter is further constructed to eliminate oscillation due to higher order resonance frequency by reducing an amount of feedback caused by the feedback means.

8. An electromechanical transducer system having a free end portion which displaces in response to an input voltage applied across the transducer, comprising:
    a bimorph including two piezoelectric elements bonded together with their respective poling directions being in opposition to one another, each of said piezoelectric elements having an inner electrode and an outer electrode on opposite sides of said element, said two outer electrodes being for application of said voltage across the transducer, and said two inner electrodes forming an intermediate electrode of the transducer;
    a series connection of two diodes, said diodes being interconnected to form a junction at their electrodes of a first polarity type, and being connected to said two outer electrodes of said transducer at their electrodes of a second polarity type; and
    a capacitor connected to said diode junction and to said intermediate electrode of said transducer;
    said diodes being connected so that when said voltage is applied across said transducer, a second voltage proportional to said input voltage is applied across one of said elements in its respective poling direction, and a third voltage proportional to said input voltage is applied across said other element in a direction opposite to its respective poling direction.

9. A transducer system as in claim 8, wherein the capacitance of said capacitor is selected so that said voltage applied across said transducer is distributed to said two piezoelectric elements according to a predetermined distribution, to enhance the linearity of said displacement of said free end portion in response to said applied voltage.

* * * * *